United States Patent
Luo et al.

(10) Patent No.: US 10,888,033 B2
(45) Date of Patent: Jan. 5, 2021

(54) COOLING SYSTEM FOR A DATA CENTER

(71) Applicant: Beijing Baidu Netcom Science and Technology Co., Ltd., Beijing (CN)

(72) Inventors: Zhiming Luo, Beijing (CN); Xiaozhong Li, Beijing (CN); Binghua Zhang, Beijing (CN)

(73) Assignee: BEIJING BAIDU NETCOM SCIENCE AND TECHNOLOGY CO., LTD., Beijing (CN)

( * ) Notice: Subject to any disclaimer, the term of this patent is extended or adjusted under 35 U.S.C. 154(b) by 212 days.

(21) Appl. No.: 16/140,033

(22) Filed: Sep. 24, 2018

(65) Prior Publication Data
US 2019/0166715 A1    May 30, 2019

(30) Foreign Application Priority Data

Nov. 29, 2017   (CN) .......................... 2017 1 1230148

(51) Int. Cl.
*H05K 7/20* (2006.01)

(52) U.S. Cl.
CPC ....... *H05K 7/2079* (2013.01); *H05K 7/20781* (2013.01); *H05K 7/20263* (2013.01); *H05K 7/20272* (2013.01)

(58) Field of Classification Search
CPC ............ H05K 7/2079; H05K 7/20781; H05K 7/20263; H05K 7/20272; H05K 7/20763;
(Continued)

(56) References Cited

U.S. PATENT DOCUMENTS 7,738,251 B2 *   6/2010  Clidaras .................... G06F 1/20
                                                              165/80.4
8,441,789 B2 *   5/2013  Wu ..................... H05K 7/20827
                                                             361/679.49
(Continued)

FOREIGN PATENT DOCUMENTS

CN          205755219 U     11/2016
CN          106647987 A      5/2017
(Continued)

OTHER PUBLICATIONS

Wang Yuebin, "Communication rack overhead type refrigerating plant", Nov. 30, 2016, Sichuan Add Mech and Electrical Equipment Co Ltd, Entire Document (Translation of CN 205755219, cited in the IDS, including Original Copy and English Abstract). (Year: 2016).*

(Continued)

*Primary Examiner* — Stephen S Sul
(74) *Attorney, Agent, or Firm* — Kinney & Lange, P.A.

(57) ABSTRACT

A cooling system for a data center includes: at least one liquid-cooling heat exchanger disposed above each of the integrated circuit boards to dissipate heat from a first heat source disposed on the integrated circuit board through an internal circulation coolant in the liquid-cooling heat exchanger; a liquid-cooling distributing device comprising a first pipeline in communication with the liquid-cooling heat exchanger, a second pipeline in communication with a first cooling tower, and a heat exchanger configured to cool the internal circulation coolant from the liquid-cooling heat exchanger to a first temperature through an external circulation coolant from the first cooling tower; and the first cooling tower configured to cool the external circulation coolant supplied via the second pipeline to the second temperature, wherein the first temperature is higher than the (Continued)

second temperature. As a result, energy consumption can be reduced and chip-level cooling can be achieved.

7 Claims, 2 Drawing Sheets

(58) Field of Classification Search
CPC ............. H05K 7/20218; H05K 7/2029; H05K 7/20254; H05K 7/20509
USPC .................................................. 361/699, 701
See application file for complete search history.

(56) References Cited

U.S. PATENT DOCUMENTS

| | | | | |
|---|---|---|---|---|
| 8,644,024 B2* | 2/2014 | Chen | ................ | H05K 7/20781 165/104.33 |
| 8,711,563 B2* | 4/2014 | Campbell | ................ | F28F 9/00 361/696 |
| 8,797,740 B2* | 8/2014 | Campbell | .......... | H05K 7/20709 29/592.1 |
| 9,110,476 B2* | 8/2015 | David | .................... | G05D 23/00 |
| 9,278,303 B1* | 3/2016 | Somani | .................... | F24F 6/14 |
| 10,531,597 B1* | 1/2020 | Eichelberg | ............ | F24F 5/0035 |
| 10,674,635 B2* | 6/2020 | Gao | ...................... | H05K 7/2079 |
| 2007/0284094 A1* | 12/2007 | Pawlak | .................... | G06F 1/20 165/122 |
| 2008/0080139 A1* | 4/2008 | Stanley | .................. | F04D 13/12 361/702 |
| 2010/0139887 A1* | 6/2010 | Slessman | ........... | H05K 7/20763 165/67 |
| 2012/0211198 A1* | 8/2012 | Kinkel | ...................... | F24F 1/02 165/104.14 |
| 2012/0279686 A1* | 11/2012 | Chainer | ............. | H05K 7/20936 165/104.21 |
| 2013/0081784 A1* | 4/2013 | Faig Palomer | .... | H05K 7/20745 165/80.2 |
| 2014/0124168 A1 | 5/2014 | Dean et al. | | |
| 2016/0120071 A1* | 4/2016 | Shedd | .................. | F25B 23/006 361/679.47 |
| 2016/0381823 A1* | 12/2016 | Ye | ........................ | H05K 7/2039 361/736 |
| 2017/0203443 A1 | 7/2017 | Lessing et al. | | |
| 2019/0008076 A1* | 1/2019 | Ghadiri Moghaddam | .................. | F24F 13/30 |

FOREIGN PATENT DOCUMENTS

| | | |
|---|---|---|
| CN | 206439960 U | 8/2017 |
| TW | 200821808 A | 5/2008 |

OTHER PUBLICATIONS

Chinese Search Report dated Nov. 11, 2017, received for corresponding Chinese Application No. 201711230148.4.
First Chinese Office Action dated Mar. 5, 2019, received for corresponding Chinese Application No. 201711230148.4.

* cited by examiner

COOLING SYSTEM FOR A DATA CENTER

The present application claims the benefit of priority to Chinese Patent Application No. 201711230148.4, filed before the State Intellectual Property Office on Nov. 29, 2017, and entitled "Cooling System for a Data Center", which is incorporated in the present application by reference in its entirety.

TECHNICAL FIELD

The present disclosure relates to the field of refrigeration technology, and in particular to a cooling system for a data center.

BACKGROUND

With the development of HPC (high-performance computing), chips on an integrated circuit board in a server are being arranged more and more densely, and the processing capability of each chip is getting better and better. This leads to a growing demand for increased heat dissipation from chips on an integrated circuit board. This demand for heat dissipation is far beyond the endurance of a traditional air-conditioning terminal. A traditional cooling system for a data center relies mainly on cooling air to facilitate dissipation of heat in the server, and the cooling air required for dissipating heat is cooled by terminal air-conditioning equipment. Air-cooling terminal air-conditioning equipment needs a fan for supplying air, which consumes a lot of energy, and with the traditional air-cooling technology it is difficult to meet the ever-increasing demand for heat dissipation, failing to achieve desired chip-level cooling.

SUMMARY

The embodiments of the present disclosure provide a cooling system for a data center to at least solve the above technical problems in the related art.

In a first aspect, an embodiment of the present disclosure provides a cooling system for a data center, wherein a plurality of cabinets are accommodate into the data center, and each of the cabinets is provided with a plurality of integrated circuit boards, wherein the cooling system comprises:

at least one liquid-cooling heat exchanger disposed above each of the integrated circuit boards to dissipate heat from a first heat source disposed on the integrated circuit board through an internal circulation coolant in the liquid-cooling heat exchanger;

a liquid-cooling distributing device comprising a first pipeline in communication with the liquid-cooling heat exchanger, a second pipeline in communication with a first cooling tower, and a heat exchanger configured to cool the internal circulation coolant from the liquid-cooling heat exchanger to a first temperature through an external circulation coolant from the first cooling tower; and the first cooling tower configured to cool the external circulation coolant supplied via the second pipeline to a second temperature, wherein the first temperature is higher than the second temperature.

With reference to the first aspect, in the first embodiment of the first aspect of the present disclosure, the liquid-cooling heat exchanger is abutted against a surface of the first heat source.

With reference to the first embodiment of the first aspect, in the second embodiment of the first aspect, a plurality of the first heat sources are disposed on the integrated circuit board, and a separate liquid-cooling heat exchanger is disposed on a surface of each of the first heat sources.

With reference to the first aspect, in the third embodiment of the first aspect of the present disclosure, a plurality of liquid-cooling heat exchangers provided on the plurality of integrated circuit boards in one cabinet are connected to the liquid-cooling distributing device.

With reference to the first aspect, in the fourth embodiment of the first aspect of the present disclosure, a plurality of liquid-cooling heat exchangers disposed on the plurality of integrated circuit boards in the plurality of cabinets are connected to the liquid-cooling distributing device.

With reference to the first aspect, in the fifth embodiment of the first aspect of the present disclosure, the cooling system further comprises: an active chilled beam disposed on top of the data center.

With reference to the fifth embodiment of the first aspect, in the sixth embodiment of the first aspect of the present disclosure, the active chilled beam comprises:

a chilled beam plenum chamber configured to receive fresh air from outside;

nozzles located on both sides of the bottom of the chilled beam plenum chamber and configured to eject the fresh air from the chilled beam plenum chamber;

an air inlet configured to allow return air in the data center to enter the active chilled beam;

a surface cooling unit disposed above the air inlet and configured to cool the return air passing through the surface cooling unit; and an air outlet configured to mix the fresh air with the cooled return air and supply the mixed air to a machine room.

With reference to the sixth embodiment of the first aspect, in a seventh embodiment of the first aspect of the present disclosure, the cooling system further comprises:

a refrigerating device connected to the surface cooling unit of the active chilled beam via a third pipeline to provide a coolant at a third temperature to the surface cooling unit.

With reference to the first aspect, the first embodiment of the first aspect, the second embodiment of the first aspect, the third embodiment of the first aspect, the fourth embodiment of the first aspect, the fifth embodiment of the first aspect, the sixth embodiment of the first aspect, or the seventh embodiment of the first aspect, in the eighth embodiment of the first aspect, the first heat source comprises any one or a combination of a central processor, a graphics processor, a field programmable gate array chip, a variable logic control chip, and a digital signal processing chip.

One of the above technical solutions has the following advantages or beneficial effects:

With a cooling system for a data center according to the embodiments of the present disclosure, a liquid-cooling heat exchanger is disposed above a first heat source of an integrated circuit board and thus it is possible to directly dissipate heat from the first heat source on the integrated circuit board, so that the chip-level cooling can be achieved. Coolant in the liquid-cooling heat exchanger is naturally cooled through the cooling tower, which can reduce energy consumption.

The above summary is for the purpose of illustration only and is not intended to be limiting in any way. In addition to the illustrative aspects, embodiments, and features described above, further aspects, embodiments, and features of present disclosure will be readily apparent by reference to the drawings and the following detailed description.

BRIEF DESCRIPTION OF THE DRAWINGS

In the drawings, the same reference numerals denote the same or similar parts or elements throughout all the drawings unless otherwise specified. The drawings are not necessarily drawn to scale. It should be understood that these drawings depict only some embodiments disclosed in accordance with present disclosure and should not be construed as limiting the scope of present disclosure.

DETAILED DESCRIPTION OF THE EMBODIMENTS

In the following, only certain exemplary embodiments are simply described. As those skilled in the art would realize, the described embodiments may be modified in various different ways, all without departing from the spirit or scope of the present disclosure. Accordingly, the drawings and description are to be regarded as illustrative in nature and not as restrictive.

Figure 1:
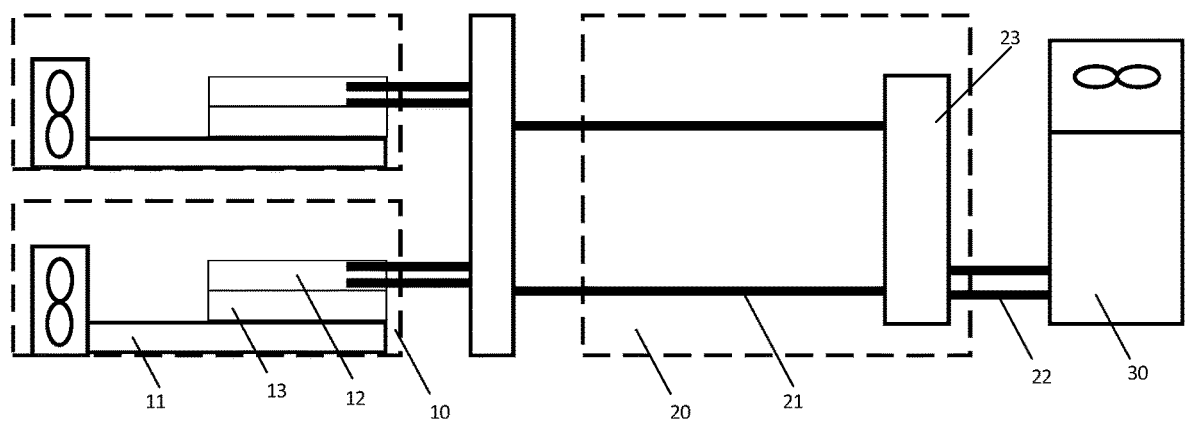
FIG. 1 is a schematic diagram of a cooling system for a data center according to an embodiment of the present disclosure.

FIG. 1 shows a schematic diagram of a cooling system for a data center according to an embodiment of the present disclosure. The data center is generally provided with a plurality of cabinets 10. Each cabinet 10 is provided with a plurality of integrated circuit boards 11. As shown in FIG. 1, the cooling system for the data center comprises:

at least one liquid-cooling heat exchanger 12 disposed above each integrated circuit board 11 to dissipate heat from a first heat source 13 disposed on the integrated circuit board 11 through the internal circulation coolant in the liquid-cooling heat exchanger 12;

a liquid-cooling distributing device 20 including a first pipeline 21 in communication with a plurality of liquid-cooling heat exchangers 12, a second pipeline 22 in communication with a first cooling tower 30, and a heat exchanger 23 for cooling the internal circulation coolant from the liquid-cooling heat exchanger 12 to a first temperature through the external circulation coolant from a first cooling tower 30; and the first cooling tower 30 configured to cool the external circulation coolant supplied via the second pipeline to a second temperature, wherein the first temperature is higher than the second temperature.

In one embodiment of the present disclosure, the at least one liquid-cooling heat exchanger 12 is abutted against the surface of the first heat source 13 on the integrated circuit board 11. In other words, the liquid-cooling heat exchanger 12 is in direct contact with the surface of the first heat source 13.

In general, a plurality of first heat sources 13 are integrated on one integrated circuit board 11. In this case, an entire liquid-cooling heat exchanger 12 may be disposed above one integrated circuit board 11 to dissipate heat from a plurality of first heat sources 13 on the integrated circuit board 11. In addition, each first heat source 13 on the integrated circuit board 11 may be provided with one separate liquid-cooling heat exchanger 12 respectively, or the first heat sources 13 on the integrated circuit board 11 may be divided into at least one group so that each group of the first heat sources 13 is provided with a separate liquid-cooling heat exchanger 12. The liquid-cooling heat exchanger 12 can be a water-cooling copper bar.

The liquid-cooling distributing device 20 includes an internal circulation portion and an external circulation portion. The internal circulation portion of the liquid-cooling distributing device 20 is connected to the liquid-cooling heat exchanger 12 in the cabinet 10 through the first pipeline 21 to supply the internal circulation coolant to the liquid-cooling heat exchanger 12, and to transport the heated coolant via the first pipeline 21 back to the liquid-cooling distributing device 20. The external circulation portion of the liquid-cooling distributing device 20 is connected to the first cooling tower 30 through the second pipeline 22 to supply the coolant to the first cooling tower 30, so as to cool the external circulation coolant to the second temperature at the first cooling tower 30. The internal circulation coolant in the internal circulation portion of the liquid-cooling distributing device 20 exchanges heat with the external circulation coolant in the external circulation portion of the liquid-cooling distributing device 20 at the heat exchanger 23, so as to cool the internal circulation coolant in the internal circulation portion to the first temperature through the external circulation coolant.

The first cooling tower 30 is connected to the liquid-cooling distributing device 20 through a second pipeline 22 to supply the external circulation coolant. The liquid-cooling distributing device 20 transfers heat from the first heat source 13 to the first cooling tower 30, and exchanges heat with outside air through the cooling tower, so as to discharge heat to the outside. Since in this part of the cooling system, a refrigerating device is not included, 100% natural cooling throughout the year can be achieved in this part.

In one embodiment of the present disclosure, each liquid-cooling heat exchanger 12 above each integrated circuit board 11 in each cabinet 10 is connected to the liquid-cooling distributing device 20 through the first pipeline 21. The first pipeline 21 may be a manifold for connecting the liquid-cooling heat exchanger 12 and the liquid-cooling distributing device 2.

In another alternative embodiment, the liquid-cooling heat exchangers 12 above the plurality of integrated circuit boards 11 contained in the plurality of cabinets 10 are connected to the liquid-cooling distributing device 20 through the first pipeline 21. In other words, one liquid-cooling distributing device 20 may distribute internal circulation coolant just for one cabinet, and may also distribute internal circulation coolant for multiple cabinets simultaneously.

In one embodiment of the present disclosure, a first heat source may be a main heat radiating element on the integrated circuit board 11. For example, the first heat source may include, but is not limited to, any one or a combination of a central processor, a graphics processor, a field programmable gate array chip, a variable logic control chip, and a digital signal processing chip.

Figure 2:
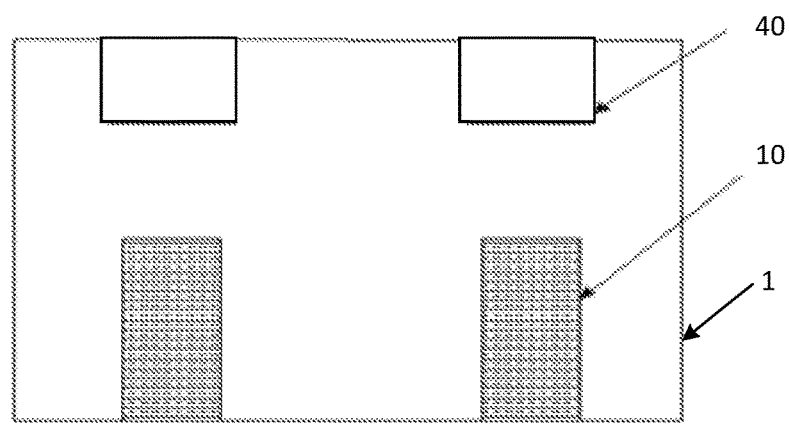
FIG. 2 is a schematic diagram of a cooling system for a data center according to another embodiment of the present disclosure.

FIG. 2 shows a schematic diagram of a cooling system for a data center according to another embodiment of the present disclosure. The cooling system for a data center as shown in FIG. 2 differs from that shown in FIG. 1 in that it further comprises an active chilled beam 40 disposed on the top of the machine room 1. The active chilled beam 40 may further provide cooling for the data center. Specifically, the active chilled beam 40 may dissipate heat from a second heat source on the integrated circuit board.

The cooling system according to the embodiment shown in FIG. 1 is mainly designed to dissipate heat from a main heat radiating element, i.e. the first heat source 13, disposed on the integrated circuit board 11. As for a further heat source(s) on the integrated circuit board 11, heat may be dissipated through the active chilled beam 40. In one embodiment of the present disclosure, a further heat sources may be, for example, a memory, a hard disk, an input/output interface (I/O interface), and other devices disposed on the integrated circuit board 11.

Figure 3:
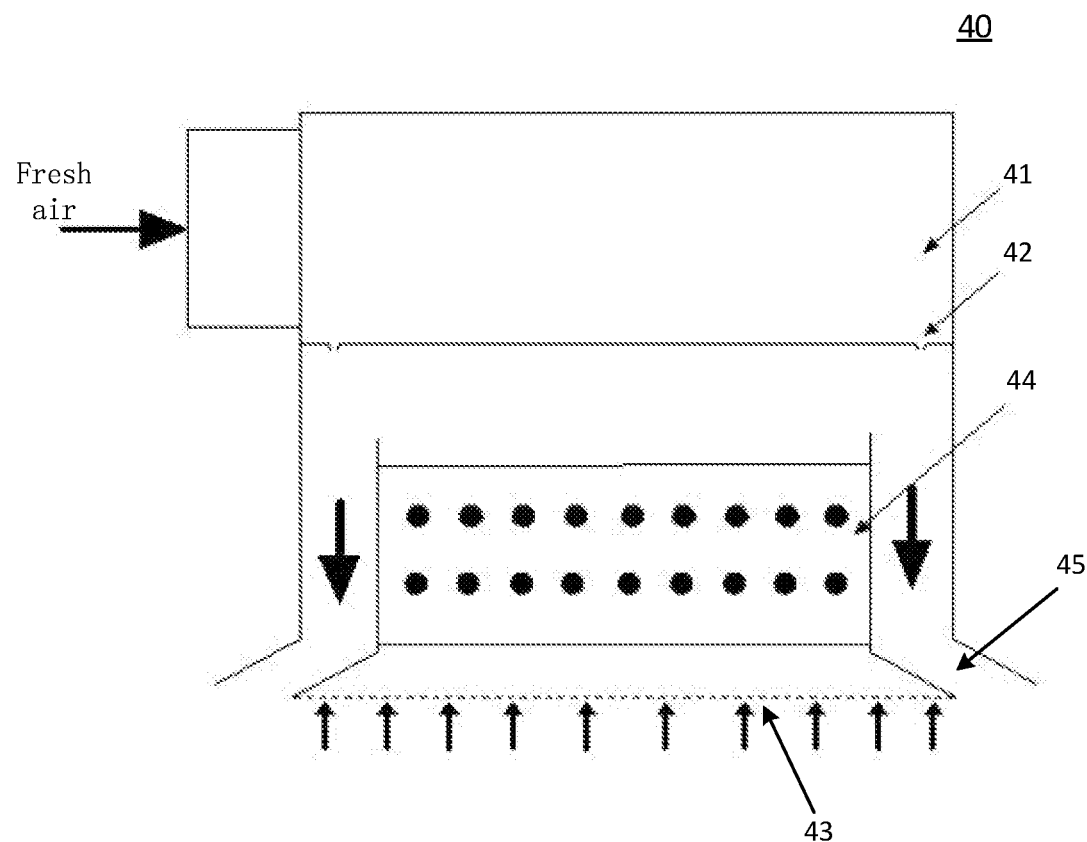
FIG. 3 is a schematic diagram of the structure of an active chilled beam according to an embodiment of the present disclosure.

FIG. 3 shows a schematic diagram of the structure of an active chilled beam according to an embodiment of the present disclosure. As shown in FIG. 3, the active chilled beam 40 comprises:

a chilled beam plenum chamber 41 for receiving fresh air from outside;

nozzles 42 located on both sides of the bottom of the chilled beam plenum chamber 41 for ejecting fresh air from the chilled beam plenum chamber 41;

an air inlet 43 configured to allow the return air in the data center to enter the active chilled beam 40;

a surface cooling unit 44 disposed above the air inlet 43 for cooling the return air passing through the surface cooling unit 44;

an air outlet 45 configured to mix the fresh air with the cooled return air and send the mixed air to the equipment room.

In the active chilled beam 40 as shown in FIG. 3, fresh air from outside is sent into the chilled beam plenum chamber 41 through the fresh air handling unit, and then is ejected at a high speed through the nozzles 42 to form a negative pressure area at the nozzles. Due to the pressure in the negative pressure area, the return air inside the data center is cooled down by the surface cooling unit 44 via the air inlet 43 and is mixed with the fresh air ejected from the nozzles 42 in the air-mixing chamber and then is sent indoor via the air outlet 45 together with the fresh air.

The data center cabinets are further cooled with an active chilled beam. Since an active chilled beam is radiantly cooled, no fan is provided at the terminals thereof. Therefore, the overall energy usage efficiency is further improved.

Figure 4:
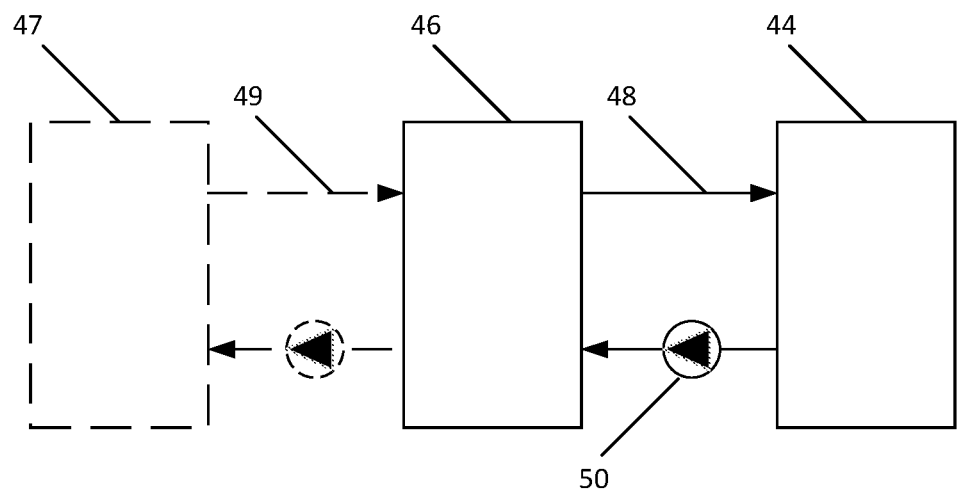
FIG. 4 is a schematic diagram of an active chilled beam system according to an embodiment of the present disclosure.

FIG. 4 shows a schematic diagram of an active chilled beam system according to an embodiment of the present disclosure. The active chilled beam system shown in FIG. 4 includes an active chilled beam as described in the embodiment shown in FIG. 3. In addition, the active chilled beam system further includes:

a refrigerating device 46 connected to the surface cooling unit 44 of the active chilled beam 40 via a third pipeline 48 to supply coolant at a third temperature to the surface cooling unit 44.

In the active chilled beam system as illustrated in FIG. 4, a circulation pump 50 may be provided at the third pipeline 48 to power the coolant in the active chilled beam system.

In one embodiment of the present disclosure, the coolant at the third temperature is supplied to the surface cooling unit 44 via the third pipeline 48, and cools the return air entering via the air inlet by passing through the surface cooling unit 44, and then the coolant returns to refrigerating device 46. The coolant is cooled to the third temperature in the refrigerating device 46.

In an embodiment of the present disclosure, the active chilled beam system may further include:

a second cooling tower 47 connected with the refrigerating device 46 via a fourth pipeline 49 to cool the coolant supplied via the fourth pipeline 49.

Using the second cooling tower 47, the coolant may be further cooled to achieve to save energy. In the active chilled beam system described in FIG. 4, a circulation pump may be provided at the fourth pipeline 49 to provide power for the coolant in the active chilled beam system.

In the description of the present specification, the description referring to the terms "one embodiment", "some embodiments", "an example", "a specific example", or "some examples" and the like means particular features, structures, materials, or characteristics included in at least one embodiment or example of present disclosure described in combination with the embodiment or example. Furthermore, the specific features, structures, materials, or characteristics described may be combined in any suitable manner in any one or more of the embodiments or examples. In addition, different embodiments or examples described in this specification and features of different embodiments or examples may be incorporated and combined by those skilled in the art without mutual contradiction.

In addition, the terms "first" and "second" are used for descriptive purposes only and are not to be construed as indicating or implying relative importance or implicitly indicating the number of indicated technical features. Thus, features defining "first" and "second" may explicitly or implicitly include at least one of the features. In the description of the present disclosure, "a plurality of" means two or more, unless expressly limited otherwise.

The foregoing descriptions are merely specific embodiments of the present disclosure, but not intended to limit the protection scope of the present disclosure. Those skilled in the art may easily conceive of various changes or modifications within the technical scope disclosed herein, all these should be covered within the protection scope of the present disclosure. Therefore, the protection scope of the present disclosure should be subject to the protection scope of the claims.

What is claimed is:

1. A cooling system for a data center, wherein a plurality of cabinets are accommodated into the data center, each of the cabinets is provided with a plurality of integrated circuit boards, and the cooling system comprises:

at least one liquid-cooling heat exchanger disposed above each of the integrated circuit boards to dissipate heat from a first heat source disposed on each of the integrated circuit boards through an internal circulation coolant in the at least one liquid-cooling heat exchanger;

a liquid-cooling distributing device comprising a first pipeline in communication with the at least one liquid-cooling heat exchanger, a second pipeline in communication with a first cooling tower, and a heat exchanger configured to cool the internal circulation coolant from the at least one liquid-cooling heat exchanger to a first temperature through an external circulation coolant from the first cooling tower; and the first cooling tower configured to cool the external circulation coolant supplied via the second pipeline to a second temperature, wherein the first temperature is higher than the second temperature, wherein the cooling system further comprises:

an active chilled beam disposed on top of the data center, wherein the active chilled beam comprises:
- a chilled beam plenum chamber configured to receive fresh air from outside;
- nozzles located on both sides of a bottom of the chilled beam plenum chamber and configured to eject the fresh air from the chilled beam plenum chamber;
- an air inlet configured to allow return air in the data center to enter the active chilled beam;
- a surface cooling unit disposed above the air inlet and configured to cool the return air passing through the surface cooling unit; and
- an air outlet configured to mix the fresh air with the cooled return air and supply the mixed air to a machine room.

2. The cooling system of claim 1, wherein the at least one liquid-cooling heat exchanger is abutted against a surface of the first heat source.

3. The cooling system of claim 2, wherein the first heat source comprises a plurality of first heat sources that are disposed on each of the integrated circuit boards, and a separate liquid-cooling heat exchanger is disposed on a surface of each of the first heat sources.

4. The cooling system of claim 1, wherein the at least one liquid-cooling heat exchanger comprises a plurality of liquid-cooling heat exchangers that are provided on the plurality of integrated circuit boards in one cabinet of the plurality of cabinets and connected to the liquid-cooling distributing device.

5. The cooling system of claim 1, wherein the at least one liquid-cooling heat exchanger comprises a plurality of liquid-cooling heat exchangers that are disposed on the plurality of integrated circuit boards in the plurality of cabinets and connected to the liquid-cooling distributing device.

6. The cooling system of claim 1, wherein the cooling system further comprises:
- a refrigerating device connected to the surface cooling unit of the active chilled beam via a third pipeline to provide a coolant at a third temperature to the surface cooling unit.

7. The cooling system of claim 1, wherein the first heat source comprises any one or a combination of a central processor, a graphics processor, a field programmable gate array chip, a variable logic control chip, and a digital signal processing chip.

* * * * *